US012771335B2

(12) United States Patent
Suda

(10) Patent No.: US 12,771,335 B2
(45) Date of Patent: Oct. 20, 2026

(54) HIGH-FREQUENCY CIRCUIT AND COMMUNICATION DEVICE

(71) Applicant: Murata Manufacturing Co., Ltd., Kyoto (JP)

(72) Inventor: Toshio Suda, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 24 days.

(21) Appl. No.: 19/084,164

(22) Filed: Mar. 19, 2025

(65) Prior Publication Data

US 2025/0309883 A1 Oct. 2, 2025

(30) Foreign Application Priority Data

Mar. 26, 2024 (JP) ................................ 2024-049348

(51) Int. Cl.

| | |
|---|---|
| ***H03K 17/0812*** | (2006.01) |
| ***H02M 3/07*** | (2006.01) |
| ***H03F 3/24*** | (2006.01) |
| ***H03K 19/0185*** | (2006.01) |

(52) U.S. Cl.

CPC ........ *H03K 17/08122* (2013.01); *H02M 3/07* (2013.01); *H03F 3/245* (2013.01); *H03K 19/018521* (2013.01); *H03F 2200/294* (2013.01)

(58) Field of Classification Search

CPC ..... H03K 17/08122; H03K 19/018521; H03K 17/102; H03K 17/693; H03K 17/161; H03K 17/6871; H02M 3/07; H03F 3/245; H03F 2200/294; H03F 2200/451; H04B 1/38

See application file for complete search history.

(56) References Cited

U.S. PATENT DOCUMENTS

| | | | | |
|---|---|---|---|---|
| 6,218,904 B1 * | 4/2001 | Panther | H03F 1/301 | 330/296 |
| 7,746,141 B2 * | 6/2010 | Takahashi | H03H 11/265 | 327/264 |
| 8,098,088 B1 * | 1/2012 | Sutandi | H03K 3/356121 | 327/309 |
| 9,610,044 B2 * | 4/2017 | Van Helleputte | A61B 5/0531 | |

(Continued)

FOREIGN PATENT DOCUMENTS

| | | | |
|---|---|---|---|
| JP | 2008-160503 | A | 7/2008 |
| JP | 5492657 | B2 | 5/2014 |
| WO | 2019009087 | A1 | 1/2019 |

*Primary Examiner* — Adam D Houston

(74) *Attorney, Agent, or Firm* — McDonald Hopkins LLC

(57) ABSTRACT

A high-frequency circuit includes a switch circuit having terminals and configured to switch between connection and disconnection between the terminals, and a charge pump circuit configured to supply a control voltage to the switch circuit, wherein the switch circuit includes an FET having a first gate, a first drain and a first source, where the first gate is supplied with a first control voltage from the charge pump circuit, the first drain is connected to the terminal, and the first source is connected to the other terminal, and an FET having a second gate, a second drain and a second source, where the second gate is supplied with a second control voltage from the charge pump circuit, the second drain and the second source are connected to a path connecting the terminal, the FET and the terminal, and the second drain and the second source are short-circuited.

16 Claims, 6 Drawing Sheets

(56) References Cited

U.S. PATENT DOCUMENTS

| | | | | |
|---|---|---|---|---|
| 11,677,353 | B2 * | 6/2023 | Choi | H03B 5/1215 331/117 R |
| 12,328,130 | B2 * | 6/2025 | Takimoto | H04B 1/006 |
| 12,456,975 | B2 * | 10/2025 | Wu | H03K 17/302 |
| 2002/0021159 | A1 * | 2/2002 | Takahashi | H03K 5/133 327/283 |
| 2003/0189466 | A1 * | 10/2003 | Kitamura | H03B 5/1215 331/100 |
| 2003/0231033 | A1 * | 12/2003 | Koch, II | H03K 17/163 327/108 |
| 2003/0231034 | A1 * | 12/2003 | Koch, II | H03K 19/0013 327/112 |
| 2003/0231072 | A1 * | 12/2003 | Mason | H03B 5/1215 331/117 R |
| 2007/0103248 | A1 * | 5/2007 | Nakamura | H03D 3/007 331/167 |
| 2007/0290744 | A1 * | 12/2007 | Adachi | H03F 3/24 330/51 |
| 2007/0296479 | A1 * | 12/2007 | Takahashi | H03K 5/133 327/288 |
| 2010/0214715 | A1 * | 8/2010 | Thaller | H03B 5/1253 361/277 |
| 2013/0217347 | A1 * | 8/2013 | Seshita | H03K 17/687 327/333 |
| 2015/0333502 | A1 * | 11/2015 | Prexl | H02H 7/1213 361/18 |
| 2016/0094207 | A1 * | 3/2016 | Crandall | H03K 3/02 327/333 |
| 2018/0343001 | A1 * | 11/2018 | Srirattana | H03H 11/342 |
| 2019/0181907 | A1 * | 6/2019 | Pfann | H03H 9/547 |
| 2020/0313703 | A1 * | 10/2020 | Choi | H04B 1/04 |
| 2020/0412151 | A1 * | 12/2020 | Chen | H02H 7/18 |
| 2023/0077189 | A1 * | 3/2023 | Hirobe | H03F 3/245 |
| 2024/0283415 | A1 * | 8/2024 | Morikawa | H03F 3/245 |
| 2025/0202474 | A1 * | 6/2025 | Pala | H03K 17/04123 |
| 2025/0309883 | A1 * | 10/2025 | Suda | H03K 17/08122 |

* cited by examiner

HIGH-FREQUENCY CIRCUIT AND COMMUNICATION DEVICE

CROSS REFERENCE TO RELATED APPLICATION

This application claims priority from Japanese Patent Application No. 2024-049348 filed on Mar. 26, 2024. The content of this application is incorporated herein by reference in its entirety.

BACKGROUND

The present disclosure relates to a high-frequency circuit and a communication device.

International Publication No. 2019/009087 discloses a high-frequency circuit module including an RF switch, a level shifter and a charge pump. The level shifter and the charge pump supply a control voltage to gates of a plurality of field effect transistors (FETs) constituting the RF switch, and control switching operation of the plurality of FETs.

BRIEF SUMMARY

However, in the above related art, the control voltage supplied from the charge pump (a voltage supply circuit) to the gate of the FET constituting the RF switch (a switch circuit) fluctuates in a transient state due to influence of a load circuit other than the above RF switch connected to the charge pump (the voltage supply circuit), and this causes a terminal (a drain or source of the FET) voltage of the RF switch (the switch circuit) to fluctuate in the above transient state, which may increase a convergence time until the terminal voltage is stabilized.

Thus, the present disclosure provides a high-frequency circuit and a communication device in which a fluctuation in terminal voltage of a switch circuit can be suppressed.

In order to achieve the above purpose, a high-frequency circuit according to an aspect of the present disclosure includes a first switch circuit having a first terminal and a second terminal and configured to switch between connection and disconnection between the first terminal and the second terminal, and a voltage supply circuit configured to supply a control voltage to the first switch circuit, wherein the first switch circuit includes a first FET having a first gate, a first drain and a first source, where the first gate is supplied with a first control voltage from the voltage supply circuit, one of the first drain and the first source is connected to the first terminal, and the other of the first drain and the first source is connected to the second terminal, and a second FET having a second gate, a second drain and a second source, where the second gate is supplied with a second control voltage from the voltage supply circuit, the second drain and the second source are connected to a path connecting the first terminal, the first FET and the second terminal, and the second drain and the second source are short-circuited.

According to the high-frequency circuit of an aspect of the present disclosure, it is possible to suppress a fluctuation in terminal voltage of a switch circuit.

BRIEF DESCRIPTION OF THE DRAWINGS

FIG. 6A is a graph showing transient response characteristics of an output voltage of a switch circuit according to the comparative example;

FIG. 6B is a graph showing transient response characteristics of an output voltage of the switch circuit according to the embodiment.

DETAILED DESCRIPTION

Figure 1:
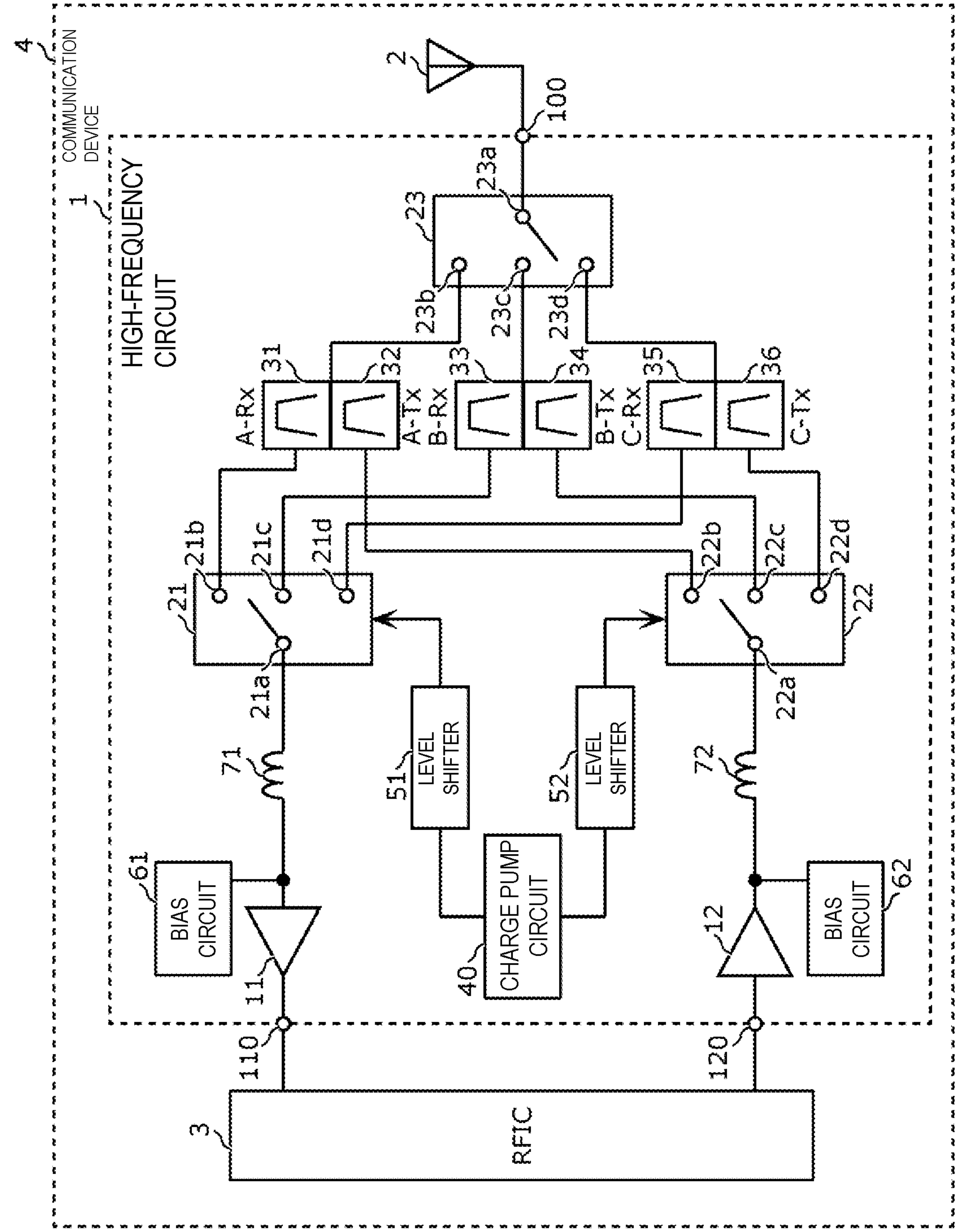
FIG. 1 is a circuit configuration diagram of a communication device according to an embodiment.

Hereinafter, embodiments of the present disclosure will be described in detail using the drawings. Note that any of the embodiments described below illustrates a comprehensive or specific example. Numerical values, shapes, materials, constituent elements, arrangements and connection modes of the constituent elements, and the like illustrated in the following embodiments are mere examples and are not intended to limit the present disclosure.

Note that each drawing is a schematic diagram in which emphasis, omission, or adjustment of ratios is performed as appropriate in order to illustrate the present disclosure, and is not necessarily illustrated strictly, and may be different from actual shapes, positional relationships, and ratios. In each drawing, substantially the same configurations are denoted by the same reference numerals, and redundant description may be omitted or simplified.

In a circuit configuration of the present disclosure, "connected" refers not only to a case of direct connection by a connection terminal and/or a wiring conductor, but also to a case of electrical connection via another circuit element. "C is connected to A and B therebetween" means that one end of C is connected to A and the other end of C is connected to B. "A path between A and B" means a path made of a conductor electrically connecting A to B. "A terminal" means a point at which a conductor in an element terminates. Note that when an impedance of a conductor between elements is sufficiently low, a terminal may be interpreted not only as a single point but as any point on the conductor between the elements or the entire conductor.

Terms indicating relationship between elements, such as "parallel" and "perpendicular", terms indicating shapes of elements, such as "rectangular", and numerical ranges do not represent only strict meanings, but also include substantially equivalent ranges, for example, errors of about several percent.

Embodiments

Hereinafter, embodiments will be described.

1. Circuit Configuration of Communication Device 4

First, a circuit configuration of a communication device 4 according to the present embodiment will be described with reference to FIG. 1. FIG. 1 is a circuit configuration diagram of the communication device 4 according to the embodiment.

Note that FIG. 1 illustrates an exemplary circuit configuration of the communication device 4 and a high-frequency circuit 1. The communication device 4 and the high-frequency circuit 1 may be implemented using any of a wide variety of circuit implementations and circuit technologies. Thus, the description of the communication device 4 and the high-frequency circuit 1 provided below is not to be construed in a limited manner.

The communication device 4 corresponds to a user terminal (user equipment (UE)) in a cellular communication system, and is typically a mobile phone, a smartphone, a tablet computer, a wearable device, or the like. Note that the communication device 4 may be an IoT (Internet of Things) sensor device, a medical/healthcare device, a vehicle, an unmanned aerial vehicle (UAV) (so-called drone), or an automated guided vehicle (AGV). Further, the communication device 4 may be used as a base station (BS) in a cellular communication system.

As illustrated in FIG. 1, the communication device 4 includes the high-frequency circuit 1, an antenna 2 and a radio frequency integrated circuit (RFIC) 3.

The high-frequency circuit 1 can transmit a high-frequency signal between the antenna 2 and the RFIC 3. An internal configuration of the high-frequency circuit 1 will be described later.

The antenna 2 is connected to an antenna connection terminal 100 of the high-frequency circuit 1. The antenna 2 receives a high-frequency signal from outside and outputs the high-frequency signal to the high-frequency circuit 1 and receives a high-frequency signal from the high-frequency circuit 1 and outputs the high-frequency signal outside the communication device 4. Note that the antenna 2 need not be included in the communication device 4. Further, the communication device 4 may further include one or more antennas in addition to the antenna 2.

The RFIC 3 is an example of a signal processing circuit that processes a high-frequency signal. Specifically, the RFIC 3 can perform signal processing on a high-frequency reception signal inputted via a receive path of the high-frequency circuit 1 by down-conversion or the like and output a reception signal generated by the signal processing to a baseband integrated circuit (BBIC: not illustrated). Further, the RFIC 3 may perform signal processing on a transmission signal inputted from the BBIC by up-conversion or the like and output a high-frequency transmission signal generated by the signal processing to the high-frequency circuit 1. Further, the RFIC 3 may include a control unit for controlling a switch circuit, a power amplifier circuit, and the like included in the high-frequency circuit 1. Note that a part or all of the control unit may be provided outside the RFIC 3 and may be included in the BBIC or the high-frequency circuit 1, for example.

2. Circuit Configuration of High-Frequency Circuit 1

Next, a circuit configuration of the high-frequency circuit 1 will be described with reference to FIG. 1. The high-frequency circuit 1 includes a low-noise amplifier circuit 11, a power amplifier circuit 12, switch circuits 21, 22 and 23, a charge pump circuit 40, level shifters 51 and 52, filters 31, 32, 33, 34, 35 and 36, bias circuits 61 and 62, inductors 71 and 72, the antenna connection terminal 100, a high-frequency output terminal 110 and a high-frequency input terminal 120. Hereinafter the constituent elements of the high-frequency circuit 1 will be described in order.

The antenna connection terminal 100 is an external connection terminal of the high-frequency circuit 1. Specifically, the antenna connection terminal 100 is connected to the antenna 2 outside the high-frequency circuit 1, and is connected to the switch circuit 23 inside the high-frequency circuit 1.

The high-frequency output terminal 110 is an external connection terminal of the high-frequency circuit 1. In particular, the high-frequency output terminal 110 is connected to the RFIC 3 outside the high-frequency circuit 1 and is connected to an output end of the low-noise amplifier circuit 11 inside the high-frequency circuit 1. The high-frequency input terminal 120 is an external connection terminal of the high-frequency circuit 1. Specifically, the high-frequency input terminal 120 is connected to the RFIC 3 outside the high-frequency circuit 1 and is connected to an input end of the power amplifier circuit 12 inside the high-frequency circuit 1.

The low-noise amplifier circuit 11 includes an amplification transistor. The amplification transistor is, for example, a bipolar transistor or an FET. An input end of the low-noise amplifier circuit 11 is connected to the switch circuit 21 with the inductor 71 interposed therebetween. The low-noise amplifier circuit 11 can amplify reception signals in bands A, B and C respectively passing through the filters 31, 33 and 35.

The power amplifier circuit 12 includes an amplification transistor. The amplification transistor is, for example, a bipolar transistor or an FET. An output end of the power amplifier circuit 12 is connected to the switch circuit 22 with the inductor 72 interposed therebetween. Transmission signals in the bands A, B and C amplified by the power amplifier circuit 12 respectively pass through the filters 32, 34 and 36, and are outputted from the antenna connection terminal 100. Note that the power amplifier circuit 12 need not be included in the high-frequency circuit 1.

The switch circuit 21 is an example of a first switch circuit, and has terminals 21*a* (a second terminal), 21*b* (a first terminal), 21*c* and 21*d*, and can switch between connection and disconnection between the terminals 21*a* and 21*b*, switch between connection and disconnection between the terminals 21*a* and 21*c*, and switch between connection and disconnection between the terminals 21*a* and 21*d* based on a control voltage supplied from the charge pump circuit 40. The terminal 21*a* is connected to the input end of the low-noise amplifier circuit 11 with the inductor 71 interposed therebetween, the terminal 21*b* is connected to the filter 31, the terminal 21*c* is connected to the filter 33, and the terminal 21*d* is connected to the filter 35. That is, the switch circuit 21 can switch between connection and disconnection between the low-noise amplifier circuit 11 and the filter 31, switch between connection and disconnection between the low-noise amplifier circuit 11 and the filter 33, and switch between connection and disconnection between the low-noise amplifier circuit 11 and the filter 35. The switch circuit 21 can connect (exclusively connect) the terminal 21*a* to only one of the terminals 21*b*, 21*c* and 21*d*. Note that the switch circuit 21 can also connect the terminal 21*a* to at least two of the terminals 21*b*, 21*c* and 21*d* at the same time. The switch circuit 21 is configured by, for example, a single-pole 3-throw (SP3T) type switch circuit including a plurality of FETs. The switch circuit 21 includes, for example, a first FET that has a first gate, a first drain and a first source, and switches between connection and disconnection between the terminals 21*a* and 21*b*, where the first gate is supplied with a first control voltage from the charge pump circuit 40, the first drain is connected to the terminal 21*b*, and the first source is connected to the terminal 21*a*.

The switch circuit 22 is an example of a second switch circuit, and has terminals 22*a* (a fifth terminal), 22*b* (a fourth terminal), 22*c* and 22*d*, and can switch between connection and disconnection between the terminals 22*a* and 22*b*, switch between connection and disconnection between the terminals 22*a* and 22*c*, and switch between connection and disconnection between the terminals 22*a* and 22*d* based on a control voltage supplied from the charge pump circuit 40. The terminal 22*a* is connected to the output end of the power amplifier circuit 12 with the inductor 72 interposed therebetween, the terminal 22*b* is connected to the filter 32, the terminal 22*c* is connected to the filter 34, and the terminal 22*d* is connected to the filter 36. That is, the switch circuit 22 can switch between connection and disconnection between the power amplifier circuit 12 and the filter 32, switch between connection and disconnection between the power amplifier circuit 12 and the filter 34, and switch between connection and disconnection between the power amplifier circuit 12 and the filter 36. The switch circuit 22 can connect (exclusively connect) the terminal 22*a* to only one of the terminals 22*b*, 22*c* and 22*d*. Note that the switch circuit 22 can also connect the terminal 22*a* to at least two of the terminals 22*b*, 22*c* and 22*d* at the same time. The switch circuit 22 is configured by, for example, an SP3T type switch circuit including a plurality of FETs. The switch circuit 22 includes, for example, a seventh FET that has a seventh gate, a seventh drain and a seventh source, and switches between connection and disconnection between the terminals 22*a* and 22*b*, where the seventh gate is supplied with a seventh control voltage from the charge pump circuit 40, the seventh drain is connected to the terminal 22*b*, the seventh source is connected to the terminal 22*a*. Note that the switch circuit 22 need not be included in the high-frequency circuit 1.

The switch circuit 23 is an example of an antenna switch, and has terminals 23*a*, 23*b*, 23*c* and 23*d*, can switch between connection and disconnection between the terminals 23*a* and 23*b*, switch between connection and disconnection between the terminals 23*a* and 23*c*, and switch between connection and disconnection between the terminals 23*a* and 23*d*. The terminal 23*a* is connected to the antenna connection terminal 100, the terminal 23*b* is connected to the filters 31 and 32, the terminal 23*c* is connected to the filters 33 and 34, and the terminal 23*d* is connected to the filters 35 and 36. That is, the switch circuit 23 can switch between connection and disconnection between the antenna 2 and the filters 31 and 32, switch between connection and disconnection between the antenna 2 and the filters 33 and 34, and switch between connection and disconnection between the antenna 2 and the filters 35 and 36. The switch circuit 23 can connect (exclusively connect) the terminal 23*a* to only one of the terminals 23*b*, 23*c* and 23*d*. Note that the switch circuit 23 can also connect the terminal 23*a* to at least two of the terminals 23*b*, 23*c* and 23*d* at the same time. The switch circuit 23 is configured by, for example, an SP3T type switch circuit including a plurality of FETs. Note that the switch circuit 23 need not be included in the high-frequency circuit 1.

The charge pump circuit 40 is an example of a voltage supply circuit and can supply a control voltage to the switch circuits 21 and 22. A circuit configuration of the charge pump circuit 40 will be described later using FIG. 2.

The level shifter 51 is connected to the charge pump circuit 40 and the switch circuit 21 therebetween, and is configured to convert a voltage outputted from the charge pump circuit 40 into a control voltage (ON voltage/OFF voltage) to be supplied to the switch circuit 21, for example, upon receiving a control signal from the RFIC 3. The level shifter 52 is connected to the charge pump circuit 40 and the switch circuit 22 therebetween, and is configured to convert a voltage outputted from the charge pump circuit 40 into a control voltage (ON voltage/OFF voltage) to be supplied to the switch circuit 22, for example, upon receiving a control signal from the RFIC 3. According to this, the control voltage outputted from the charge pump circuit 40 can be converted into a control voltage corresponding to sizes and characteristics of the FETs constituting the switch circuits 21 and 22.

The inductor 71 is connected to the input end of the low-noise amplifier circuit 11 and the terminal 21*a* of the switch circuit 21 therebetween. The inductor 71 can achieve impedance matching between the low-noise amplifier circuit 11 and the switch circuit 21. Note that the inductor 71 need not be included in the high-frequency circuit 1.

The inductor 72 is connected to the output end of the power amplifier circuit 12 and the terminal 22*a* of the switch circuit 22 therebetween. The inductor 72 can achieve impedance matching between the power amplifier circuit 12 and the switch circuit 22. Note that the inductor 72 need not be included in the high-frequency circuit 1.

The filter 31 is an acoustic wave filter that is connected to the switch circuits 21 and 23 therebetween and has a pass band including a reception band (A-Rx) in the band A. One end of the filter 31 is connected to the terminal 21*b*, and the other end of the filter 31 is connected to the terminal 23*b*. The filter 32 is an acoustic wave filter that is connected to the switch circuits 22 and 23 therebetween and has a pass band including a transmission band (A-Tx) in the band A. One end of the filter 32 is connected to the terminal 22*b*, and the other end of the filter 32 is connected to the terminal 23*b*. The filters 31 and 32 are filters for frequency division duplex and constitute a duplexer capable of simultaneously transmitting a transmission signal and a reception signal in the band A. Note that the filters 31 and 32 may be filters for time division duplex, and in this case, the filters 31 and 32 have a pass band including the transmission band and the reception band in the band A. Note that the filters 31 and 32 need not be included in the high-frequency circuit 1.

The filter 33 is an acoustic wave filter that is connected to the switch circuits 21 and 23 therebetween and has a pass band including a reception band (B-Rx) in the band B. One end of the filter 33 is connected to the terminal 21*c*, and the other end of the filter 33 is connected to the terminal 23*c*. The filter 34 is an acoustic wave filter that is connected to the switch circuits 22 and 23 therebetween and has a pass band including a transmission band (B-Tx) in the band B. One end of the filter 34 is connected to the terminal 22*c*, and the other end of the filter 34 is connected to the terminal 23*c*. The filters 33 and 34 are filters for frequency division duplex and constitute a duplexer capable of simultaneously transmitting a transmission signal and a reception signal in the band B. Note that the filters 33 and 34 may be filters for time division duplex, and in this case, the filters 33 and 34 have a pass band including the transmission band and the reception band in the band B. Note that the filters 33 and 34 need not be included in the high-frequency circuit 1.

The filter 35 is an acoustic wave filter that is connected to the switch circuits 21 and 23 therebetween and has a pass band including a reception band (C-Rx) in the band C. One end of the filter 35 is connected to the terminal 21*d*, and the other end of the filter 35 is connected to the terminal 23*d*. The filter 36 is an acoustic wave filter that is connected to the switch circuits 22 and 23 therebetween and has a pass band including a transmission band (C-Tx) in the band C. One end of the filter 36 is connected to the terminal 22*d*, and the other end of the filter 36 is connected to the terminal 23*d*. The filters 35 and 36 are filters for frequency division duplex and constitute a duplexer capable of simultaneously transmitting a transmission signal and a reception signal in the band C. Note that the filters 35 and 36 may be filters for time division duplex, and in this case, the filters 35 and 36 have a pass band including the transmission band and the reception band in the band C. Note that the filters 35 and 36 need not be included in the high-frequency circuit 1.

Note that the filters 31 to 36 need not be the acoustic wave filters. For example, some or all of the filters 31 to 36 may be LC filters.

The band A to the band C are frequency bands for a communication system constructed using a radio access technology (RAT), and are defined in advance by standardizing bodies and the like (for example, 3rd Generation Partnership Project (3GPP) (registered trademark), Institute of Electrical and Electronics Engineers (IEEE) and the like). Examples of the communication system include a 5th Generation New Radio (5GNR) system, a Long Term Evolution (LTE) system, a Wireless Local Area Network (WLAN) system, and the like. Note that the band A to the band C may be frequency bands different from each other or may be the same band. For example, the band A and the band C may be the same, and the band B and the band C may be the same.

The bias circuit 61 can supply a bias signal to the low-noise amplifier circuit 11 based on a control signal supplied from the RFIC 3, for example. The bias circuit 62 can supply a bias signal to the power amplifier circuit 12 based on a control signal supplied from the RFIC 3, for example. Note that the bias circuits 61 and 62 need not be included in the high-frequency circuit 1.

Note that in the present embodiment, the low-noise amplifier circuit 11, the switch circuit 21, the charge pump circuit 40 and the bias circuit 61 may be included in one integrated circuit.

3. Circuit Configuration of Charge Pump Circuit 40

Figure 2:
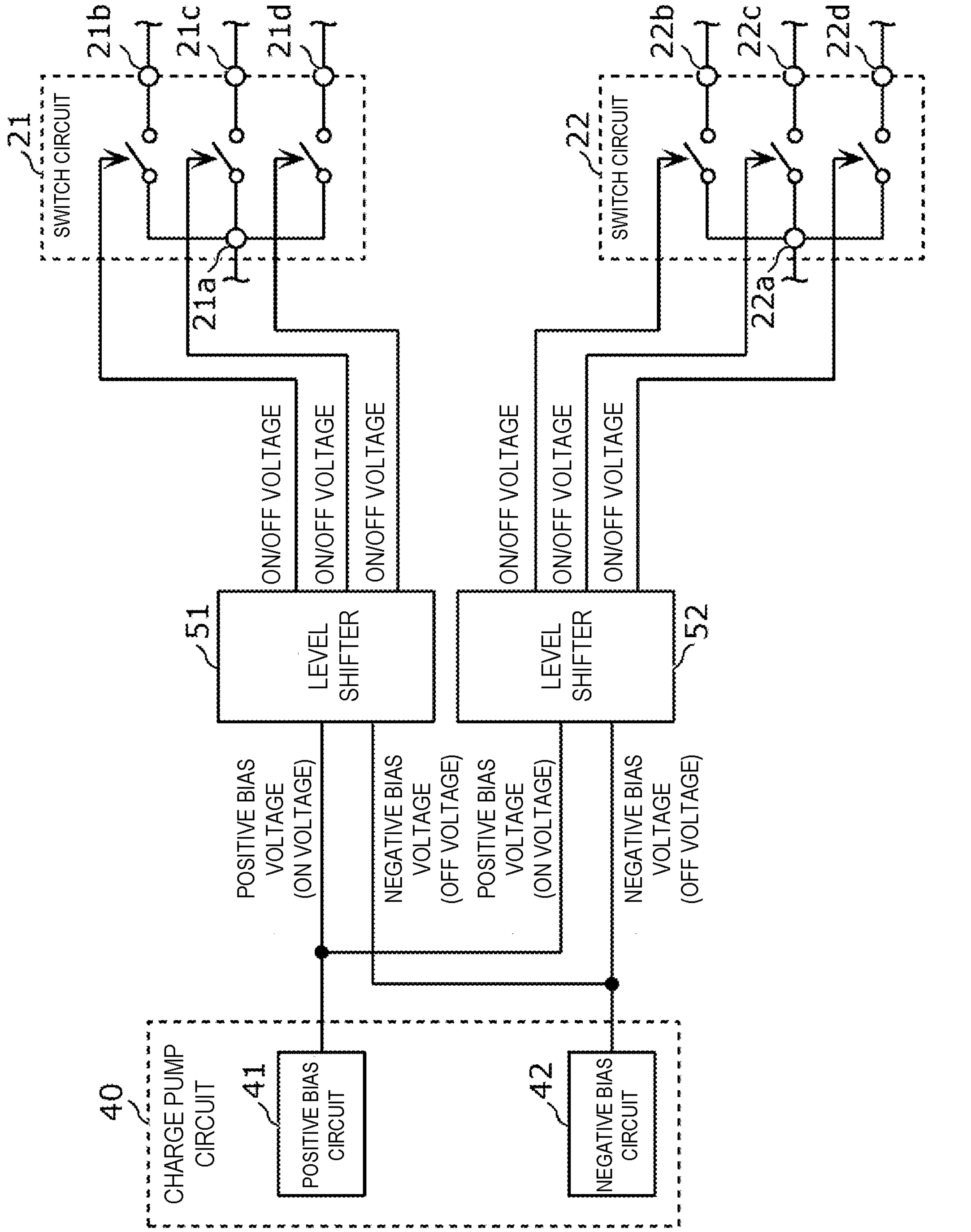
FIG. 2 is a circuit configuration diagram of a charge pump circuit and a switch circuit according to the embodiment.

Next, a circuit configuration of the charge pump circuit 40 will be described with reference to FIG. 2. FIG. 2 is a circuit configuration diagram of the charge pump circuit 40 and the switch circuits 21 and 22 according to the embodiment.

Note that FIG. 2 illustrates an exemplary circuit configuration of the charge pump circuit 40 and the switch circuits 21 and 22, and the charge pump circuit 40 and the switch circuits 21 and 22 may be implemented using any of a wide variety of circuit implementations and circuit technologies. Thus, the description of the charge pump circuit 40 and the switch circuits 21 and 22 provided below is not to be construed in a limited manner.

As illustrated in FIG. 2, the charge pump circuit 40 includes a positive bias circuit 41 and a negative bias circuit 42.

The positive bias circuit 41 includes a booster circuit, a step-down circuit, an inverting circuit, or any combination thereof, and is connected to the level shifters 51 and 52. The positive bias circuit 41 can output a positive bias voltage (ON voltage) by performing boosting, stepping down, inversion, or any combination thereof of an input voltage by using a pulse wave generated by an oscillator (not illustrated).

The negative bias circuit 42 includes a booster circuit, a step-down circuit, an inverting circuit, or any combination thereof, and is connected to the level shifters 51 and 52. The negative bias circuit 42 can output a negative bias voltage (OFF voltage) by performing boosting, stepping down, inversion, or any combination thereof of an input voltage by using a pulse wave generated by an oscillator (not illustrated).

Note that the circuit configuration of the charge pump circuit 40 is an example and is not limited to the circuit configuration of FIG. 2. For example, the charge pump circuit 40 need not include one of the positive bias circuit 41 and the negative bias circuit 42. In this case, one of a positive bias and a negative bias, and a ground voltage are supplied to the switch circuits 21 and 22. Further, the charge pump circuit 40 may include a bandgap reference circuit (not illustrated), an error amplifier circuit (not illustrated), and the like.

In addition, in the present embodiment, the charge pump circuit 40 is used as a voltage supply circuit, but the voltage supply circuit is not limited to the charge pump circuit. For example, a bootstrap circuit and/or a switched-capacitor circuit may be used as the voltage supply circuit.

Figure 3:
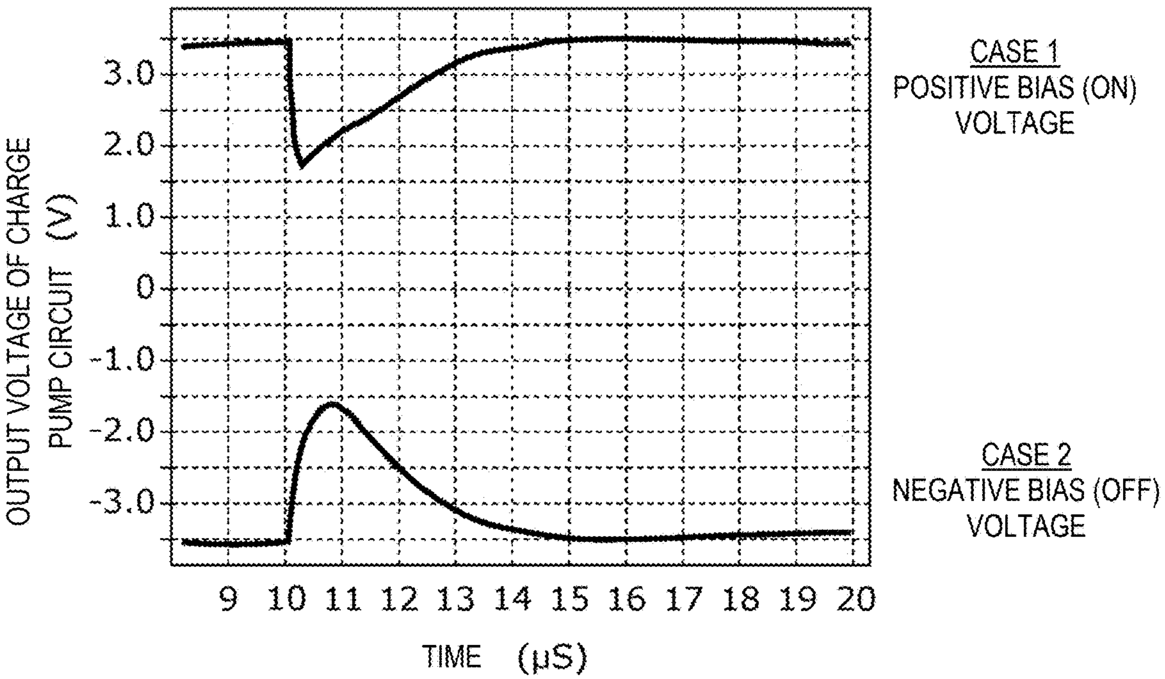
FIG. 3 is a graph showing transient response characteristics of an output voltage of the charge pump circuit.

Here, output voltage characteristics of the charge pump circuit 40 will be described. FIG. 3 is a graph showing transient response characteristics of an output voltage of the charge pump circuit 40.

The charge pump circuit 40 not only supplies a control signal to the switch circuit 21 disposed in a receive path but also supplies a control signal to the switch circuit 22 disposed in a transmission path. The control voltage supplied from the charge pump circuit 40 to the switch circuit 22 may temporarily fluctuate at a time when each FET of the switch circuit 22 is switched from an ON state to an OFF state or from the OFF state to the ON state. In particular, in the switch circuit 22 disposed in the transmission path, an FET having a large gate width (a gate capacitance) is disposed in order to support passage of a high-output transmission signal. In the high-frequency circuit 1 according to the present embodiment, a gate width of the seventh FET included in the switch circuit 22 is larger than a gate width of the first FET included in the switch circuit 21.

Due to the large gate capacitance of the seventh FET included in the switch circuit 22, as shown in FIG. 3, the ON voltage outputted from the charge pump circuit 40 may temporarily lower at a time when the negative bias voltage (OFF voltage: for example, −3.5 V) changes to the positive bias voltage (ON voltage: for example, 3.5 V) (Case 1 in FIG. 3). Further, the OFF voltage outputted from the charge pump circuit 40 may temporarily rise at a time when the positive bias voltage (ON voltage: for example, 3.5 V) changes to the negative bias voltage (OFF voltage: for example, −3.5 V) (Case 2 in FIG. 3). A period until the ON voltage that temporarily lowered in Case 1 settles to the ON voltage that is steady and a period until the OFF voltage that temporarily rose in Case 2 settles to the OFF voltage that is steady are about several microseconds.

The temporary fluctuation of the control voltage outputted from the charge pump circuit 40 to the switch circuit 22 also occurs in the control voltage outputted from the same charge pump circuit 40 to the switch circuit 21, and causes drain potentials or source potentials of the respective FETs constituting the switch circuit 21 to fluctuate via gate capacitances of the above respective FETs. Thus, when a circuit (for example, the input end of the low-noise amplifier circuit 11, or the like) in which high-frequency characteristics sensitively respond to the above potential fluctuation is connected to the terminal 21*a* of the switch circuit 21, a transient response of the above circuit (for example, the low-noise amplifier circuit 11) may be significantly deteriorated due to a long convergence time of the potential fluctuation.

Figure 4:
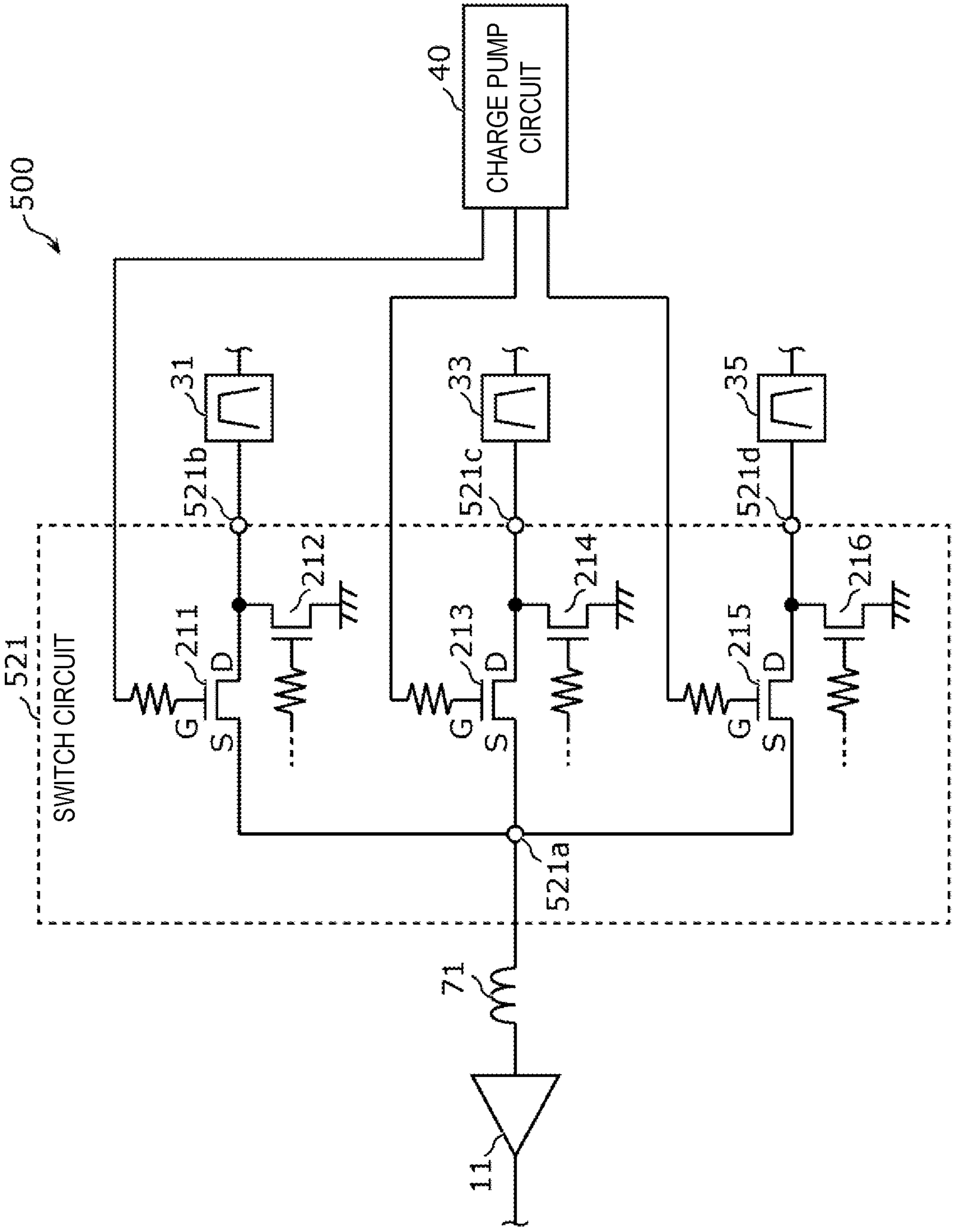
FIG. 4 is a circuit configuration diagram of a high-frequency circuit according to a comparative example.

4. Configuration of High-Frequency Circuit 500 According to Comparative Example Next, an example of a circuit configuration of a high-frequency circuit in the related art will be described. FIG. 4 is a circuit configuration diagram of a high-frequency circuit 500 according to a comparative example. As illustrated in the drawing, the high-frequency circuit 500 according to the comparative example includes the low-noise amplifier circuit 11, a switch circuit 521, the charge pump circuit 40, the filters 31, 33 and 35, and the inductor 71. Note that although not illustrated, the high-frequency circuit 500 may include the power amplifier circuit 12, the level shifters 51 and 52, and the switch circuit 22. The high-frequency circuit 500 according to the comparative example is different from the high-frequency circuit 1 according to the embodiment only in a circuit configuration of the switch circuit 521 disposed in a receive path. Hereinafter, the high-frequency circuit 500 according to the comparative example will be described focusing on a configuration of the switch circuit 521, which is a different configuration, while the description of the same configurations as those of the high-frequency circuit 1 according to the embodiment is omitted.

The switch circuit 521 includes terminals 521*a*, 521*b*, 521*c* and 521*d*, and FETs 211, 212, 213, 214, 215 and 216.

The terminal 521*a* is connected to the input end of the low-noise amplifier circuit 11 with the inductor 71 interposed therebetween, the terminal 521*b* is connected to the filter 31, the terminal 521*c* is connected to the filter 33, and the terminal 521*d* is connected to the filter 35.

The FET 211 is an n-channel type metal-oxide-semiconductor field-effect-transistor (MOSFET) having a gate, a drain and a source, where the gate is connected to the charge pump circuit 40, the drain is connected to the terminal 521*b*, and the source is connected to the terminal 521*a*. The FET 212 is an n-channel type MOSFET having a gate, a drain and a source, where the gate is connected to the charge pump circuit 40, the drain is connected to the terminal 521*b*, and the source is connected to a ground.

When the ON voltage is supplied to the gate of the FET 211 and at the same time the OFF voltage is supplied to the gate of the FET 212 from the charge pump circuit 40, the FET 211 is brought into the ON state and the FET 212 is brought into the OFF state. Thus, a reception signal in the band A passing through the filter 31 passes through the terminal 521*b*, the FET 211 and the terminal 521*a*, and is inputted to the low-noise amplifier circuit 11.

On the other hand, when the OFF voltage is supplied to the gate of the FET 211 and at the same time the ON voltage is supplied to the gate of the FET 212 from the charge pump circuit 40, the FET 211 is brought into the OFF state and the FET 212 is brought into the ON state. Thus, reception signals in the band A, the band B and the band C do not pass through the FET 211.

Note that each of the FETs 211 and 212 may be a p-channel type MOSFET or another FET. When each of the FETs 211 and 212 is a p-channel type MOSFET, the gate of the FET 211 is connected to the charge pump circuit 40, the source of the FET 211 is connected to the terminal 521*b*, and the drain of the FET 211 is connected to the terminal 521*a*. Further, the gate of the FET 212 is connected to the charge pump circuit 40, the source of the FET 212 is connected to the terminal 521*b*, and the drain of the FET 212 is connected to the ground.

The FET 213 is an n-channel type MOSFET having a gate, a drain and a source, where the gate is connected to the charge pump circuit 40, the drain is connected to the terminal 521*c*, and the source is connected to the terminal 521*a*. The FET 214 is an n-channel type MOSFET having a gate, a drain and a source, where the gate is connected to the charge pump circuit 40, the drain is connected to the terminal 521*c*, and the source is connected to the ground.

When the ON voltage is supplied to the gate of the FET 213 and at the same time the OFF voltage is supplied to the gate of the FET 214 from the charge pump circuit 40, the FET 213 is brought into the ON state and the FET 214 is brought into the OFF state. Thus, a reception signal in the band B passing through the filter 33 passes through the terminal 521*c*, the FET 213 and the terminal 521*a*, and is inputted to the low-noise amplifier circuit 11.

On the other hand, when the OFF voltage is supplied to the gate of the FET 213 and at the same time the ON voltage is supplied to the gate of the FET 214 from the charge pump circuit 40, the FET 213 is brought into the OFF state and the FET 214 is brought into the ON state. Thus, reception signals in the band A, the band B and the band C do not pass through the FET 213.

Note that each of the FETs 213 and 214 may be a p-channel type MOSFET or another FET. When each of the FETs 213 and 214 is a p-channel type MOSFET, the gate of the FET 213 is connected to the charge pump circuit 40, the source of the FET 213 is connected to the terminal 521*c*, and the drain of the FET 213 is connected to the terminal 521*a*. Further, the gate of the FET 214 is connected to the charge pump circuit 40, the source of the FET 214 is connected to the terminal 521*c*, and the drain of the FET 214 is connected to the ground.

The FET 215 is an n-channel type MOSFET having a gate, a drain and a source, where the gate is connected to the charge pump circuit 40, the drain is connected to the terminal 521*d*, and the source is connected to the terminal 521*a*. The FET 216 is an n-channel type MOSFET having a gate, a drain and a source, where the gate is connected to the charge pump circuit 40, the drain is connected to the terminal 521*d*, and the source is connected to the ground.

When the ON voltage is supplied to the gate of the FET 215 and at the same time the OFF voltage is supplied to the gate of the FET 216 from the charge pump circuit 40, the FET 215 is brought into the ON state and the FET 216 is brought into the OFF state. Thus, a reception signal in the band C passing through the filter 35 passes through the terminal 521*d*, the FET 215 and the terminal 521*a*, and is inputted to the low-noise amplifier circuit 11.

On the other hand, when the OFF voltage is supplied to the gate of the FET 215 and at the same time the ON voltage is supplied to the gate of the FET 216 from the charge pump circuit 40, the FET 215 is brought into the OFF state and the FET 216 is brought into the ON state. Thus, reception signals in the band A, the band B and the band C do not pass through the FET 215.

Note that each of the FETs 215 and 216 may be a p-channel type MOSFET or another FET. When each of the FETs 215 and 216 is a p-channel type MOSFET, the gate of the FET 215 is connected to the charge pump circuit 40, the source of the FET 215 is connected to the terminal 521*d*, and the drain of the FET 215 is connected to the terminal 521*a*. Further, the gate of the FET 216 is connected to the charge pump circuit 40, the source of the FET 216 is connected to the terminal 521*d*, and the drain of the FET 216 is connected to the ground.

In the high-frequency circuit 500 having the above configuration, when the ON voltage of Case 1 or the OFF voltage of Case 2 shown in FIG. 3 is supplied from the charge pump circuit 40 to the switch circuit 521, a source potential of the FET 211 may fluctuate via a gate capacitance of the FET 211, a source potential of the FET 213 may fluctuate via a gate capacitance of the FET 213, and a source potential of the FET 215 may fluctuate via a gate capacitance of the FET 215. Here, the fluctuation of the source potential of the FET that is in the ON state among the FETs 211, 213 and 215 is transmitted to the input end of the low-noise amplifier circuit 11, and a transient response of the low-noise amplifier circuit 11 may be greatly deteriorated.

5. Configuration of Switch Circuit 21 According to Embodiment

Figure 5:
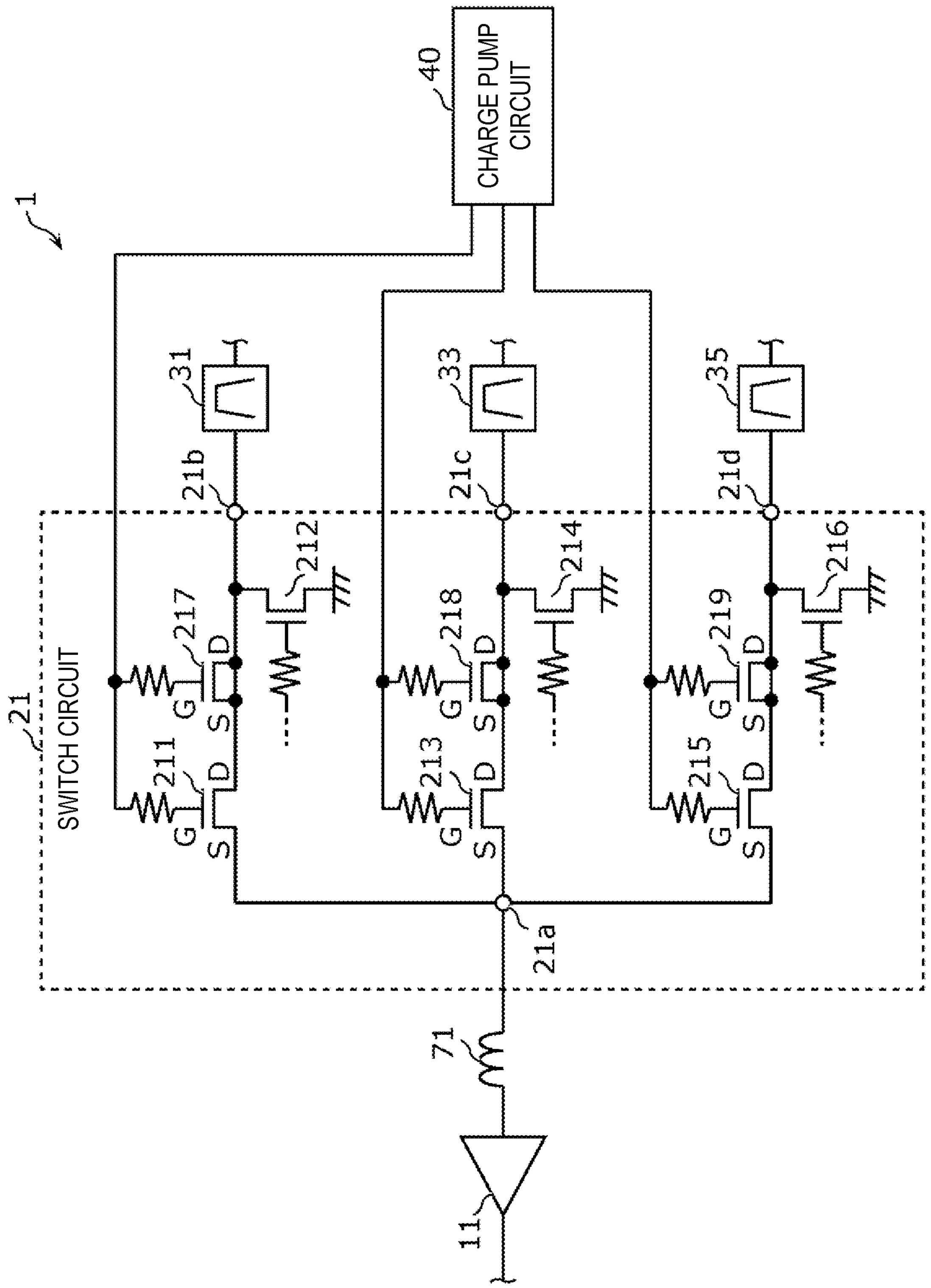
FIG. 5 is a circuit configuration diagram of a high-frequency circuit according to the embodiment.

Next, an example of the circuit configuration of the high-frequency circuit 1 according to the embodiment will be described. FIG. 5 is a circuit configuration diagram of the high-frequency circuit 1 according to the embodiment. As illustrated in the drawing, the high-frequency circuit 1 according to the embodiment includes the low-noise amplifier circuit 11, the switch circuit 21, the charge pump circuit 40, the filters 31, 33 and 35, and the inductor 71. Note that although not illustrated, the high-frequency circuit 1 includes the power amplifier circuit 12, the level shifters 51 and 52, and the switch circuit 22. Hereinafter, a circuit configuration and switching operation of the switch circuit 21 will be described.

The switch circuit 21 includes the terminals 21*a* (the second terminal), 21*b* (the first terminal), 21*c* (a third terminal) and 21*d*, the FETs 211, 212, 213, 214, 215 and 216, and FETs 217, 218 and 219.

The terminal 21*a* is connected to the input end of the low-noise amplifier circuit 11 with the inductor 71 interposed therebetween, the terminal 21*b* is connected to the filter 31, the terminal 21*c* is connected to the filter 33, and the terminal 21*d* is connected to the filter 35.

The FET 211 is an example of a first FET and is an n-channel type MOSFET having a first gate, a first drain and a first source, where the first gate is supplied with a first control voltage from the charge pump circuit 40, the first drain is connected to the terminal 21*b* (the first terminal), and the first source is connected to the terminal 21*a* (the second terminal). The FET 212 is an example of a third FET and is an n-channel type MOSFET having a third gate, a third drain and a third source, where the third gate is supplied with a third control voltage from the charge pump circuit 40, the third drain is connected to the terminal 21*b*, and the third source is connected to the ground.

The FET 217 is an example of a second FET, and is an n-channel type MOSFET having a second gate, a second drain and a second source, where the second gate is supplied with a second control voltage from the charge pump circuit 40, the second drain and the second source are connected to a path connecting the terminal 21*b*, the FET 211 and the terminal 21*a*, and the second drain and the second source are short-circuited.

When a first ON voltage is supplied to the first gate and at the same time the OFF voltage is supplied to the third gate from the charge pump circuit 40, the FET 211 is brought into the ON state and the FET 212 is brought into the OFF state. Thus, a reception signal in the band A passing through the filter 31 passes through the terminal 21*b*, the FET 211 and the terminal 21*a*, and is inputted to the low-noise amplifier circuit 11.

On the other hand, when a first OFF voltage is supplied to the first gate and at the same time the ON voltage is supplied to the third gate from the charge pump circuit 40, the FET 211 is brought into the OFF state and the FET 212 is brought into the ON state. Thus, reception signals in the band A, the band B and the band C do not pass through the FET 211.

Note that each of the FETs 211, 212 and 217 may be a p-channel type MOSFET or another FET. When each of the FETs 211, 212 and 217 is a p-channel type MOSFET, the first gate is connected to the charge pump circuit 40, the first source is connected to the terminal 21*b*, and the first drain is connected to the terminal 21*a*. Further, the third gate is connected to the charge pump circuit 40, the third source is connected to the terminal 21*b*, and the third drain is connected to the ground. Further, the second gate is connected to the charge pump circuit 40, the second drain and the second source are connected to the path connecting the terminal 21*b*, the FET 211 and the terminal 21*a*, and the second drain and the second source are short-circuited.

The FET 213 is an example of a fourth FET and is an n-channel type MOSFET having a fourth gate, a fourth drain and a fourth source, where the fourth gate is supplied with a fourth control voltage from the charge pump circuit 40, the fourth drain is connected to the terminal 21*c* (the third terminal), and the fourth source is connected to the terminal 21*a* (the second terminal). The FET 214 is an example of a sixth FET and is an n-channel type MOSFET having a sixth gate, a sixth drain and a sixth source, where the sixth gate is supplied with a sixth control voltage from the charge pump circuit 40, the sixth drain is connected to the terminal 21*c*, and the sixth source is connected to the ground.

The FET 218 is an example of a fifth FET, and is an n-channel type MOSFET having a fifth gate, a fifth drain and a fifth source, where the fifth gate is supplied with a fifth control voltage from the charge pump circuit 40, the fifth drain and the fifth source are connected to a path connecting the terminal 21*c*, the FET 213 and the terminal 21*a*, and the fifth drain and the fifth source are short-circuited.

When a fourth ON voltage is supplied to the fourth gate and at the same time the OFF voltage is supplied to the sixth gate from the charge pump circuit 40, the FET 213 is brought into the ON state and the FET 214 is brought into the OFF state. Thus, a reception signal in the band B passing through the filter 33 passes through the terminal 21*c*, the FET 213 and the terminal 21*a*, and is inputted to the low-noise amplifier circuit 11.

On the other hand, when a fourth OFF voltage is supplied to the fourth gate and at the same time the ON voltage is supplied to the sixth gate from the charge pump circuit 40, the FET 213 is brought into the OFF state and the FET 214 is brought into the ON state. Thus, reception signals in the band A, the band B and the band C do not pass through the FET 213.

Note that each of the FETs 213, 214 and 218 may be a p-channel type MOSFET or another FET. When each of the FETs 213, 214 and 218 is a p-channel type MOSFET, the fourth gate is connected to the charge pump circuit 40, the fourth source is connected to the terminal 21*c*, and the fourth drain is connected to the terminal 21*a*. Further, the sixth gate is connected to the charge pump circuit 40, the sixth source is connected to the terminal 21*c*, and the sixth drain is connected to the ground. Further, the fifth gate is connected to the charge pump circuit 40, the fifth drain and the fifth source are connected to the path connecting the terminal 21*c*, the FET 213 and the terminal 21*a*, and the fifth drain and the fifth source are short-circuited.

The FET 215 is an n-channel type MOSFET having a gate, a drain and a source, where the gate is supplied with a control voltage from the charge pump circuit 40, the drain is connected to the terminal 21*d*, and the source is connected to the terminal 21*a*. The FET 216 is an n-channel type MOSFET having a gate, a drain and a source, where the gate is supplied with a control voltage from the charge pump circuit 40, the drain is connected to the terminal 21*d*, and the source is connected to the ground.

The FET 219 is an n-channel type MOSFET having a gate, a drain and a source, where the gate is supplied with a control voltage from the charge pump circuit 40, the drain and the source are connected to a path connecting the terminal 21*d*, the FET 215 and the terminal 21*a*, and the drain and the source are short-circuited.

When the ON voltage is supplied to the gate of the FET 215 and at the same time the OFF voltage is supplied to the gate of the FET 216 from the charge pump circuit 40, the FET 215 is brought into the ON state and the FET 216 is brought into the OFF state. Thus, a reception signal in the band C passing through the filter 35 passes through the terminal 21*d*, the FET 215 and the terminal 21*a*, and is inputted to the low-noise amplifier circuit 11.

On the other hand, when the OFF voltage is supplied to the gate of the FET 215 and at the same time the ON voltage is supplied to the gate of the FET 216 from the charge pump circuit 40, the FET 215 is brought into the OFF state and the FET 216 is brought into the ON state. Thus, reception signals in the band A, the band B and the band C do not pass through the FET 215.

Note that each of the FETs 215, 216 and 219 may be a p-channel type MOSFET or another FET. When each of the FETs 215, 216 and 219 is a p-channel type MOSFET, the gate of the FET 215 is connected to the charge pump circuit 40, the source of the FET 215 is connected to the terminal 21*d*, and the drain of the FET 215 is connected to the terminal 21*a*. Further, the gate of the FET 215 is connected to the charge pump circuit 40, the source is connected to the terminal 21*d*, and the drain is connected to the ground. Further, the gate of the FET 219 is connected to the charge pump circuit 40, the drain and the source of the FET 219 are connected to the path connecting the terminal 21*d*, the FET 215 and the terminal 21*a*, and the drain and the source of the FET 219 are short-circuited.

Further, characteristics of the control voltage outputted from the charge pump circuit 40 in a transient state will be described. For example, a case is assumed where the FET 211 is brought into the ON state and the FETs 213 and 215 are brought into the OFF state among the FETs 211, 213 and 215, and a reception signal in the band A is amplified by the low-noise amplifier circuit 11. In this case, in a first transient state where the first control voltage outputted from the charge pump circuit 40 changes from the first OFF voltage to the first ON voltage, the first ON voltage temporarily drops, and at the same time, the fourth control voltage outputted from the charge pump circuit 40 changes from the fourth ON voltage to the fourth OFF voltage, and the fourth OFF voltage temporarily rises, at the same time, the control voltage outputted from the charge pump circuit 40 to the FET 215 changes from the ON voltage to the OFF voltage, and the OFF voltage temporarily rises.

According to this, in the first transient state, a voltage is applied to the first gate of the FET 211, the voltage being obtained by simultaneously adding a component for the first ON voltage to temporarily drop, a component for the fourth OFF voltage to temporarily rise and a component for the OFF voltage for bringing the FET 215 into the OFF state to temporarily rise in the first transient state. Note that whether the gate voltage of the FET 211 temporarily drops or rises is determined by the gate capacitances and characteristics of the FETs 211 to 216.

In the switch circuit 21 that receives the control voltage having the above characteristics from the charge pump circuit 40, switching operation is performed in any of the following aspects.

Aspect 1

When the first control voltage outputted from the charge pump circuit 40 is the first ON voltage for bringing the FET 211 into the ON state, the second control voltage outputted from the charge pump circuit 40 is set to a second ON voltage for bringing the FET 217 in which the second drain and the second source of the FET 217 are not short-circuited into the ON state.

According to this, in the first transient state in which the first control voltage changes from the first OFF voltage to the first ON voltage, when a voltage of the terminal 21*a* temporarily rises in a case where the FET 217 is not disposed, a voltage between the second gate and the second source of the FET 217 temporarily drops in the first transient state (the FET 217 has the characteristics of Case 1 in FIG. 3), and thus the voltage rising of the terminal 21*a* due to the first control voltage can be suppressed.

As a circuit configuration for achieving the above Aspect 1, as illustrated in FIG. 5, the second gate of the FET 217 is connected to the first gate of the FET 211.

According to this, the FET 217 operates in a logically identical manner to the FET 211, and thus in the first transient state in which the first control voltage changes from the first OFF voltage to the first ON voltage, the voltage between the second gate and the second source temporarily drops in the FET 217, and thus the voltage rising of the terminal 21*a* due to the first control voltage can be suppressed.

Aspect 2

When the first control voltage outputted from the charge pump circuit 40 is the first ON voltage for bringing the FET 211 into the ON state, the second control voltage outputted from the charge pump circuit 40 is set to a second ON voltage for bringing the FET 217 in which the second drain and the second source of the FET 217 are not short-circuited into the ON state. Further, when the fourth control voltage outputted from the charge pump circuit 40 is the fourth ON voltage for bringing the FET 213 into the ON state, the fifth control voltage outputted from the charge pump circuit 40 is set to a fifth ON voltage for bringing the FET 218 in which the fifth drain and the fifth source of the FET 218 are not short-circuited into the ON state.

According to this, in the first transient state in which the first control voltage changes from the first OFF voltage to the first ON voltage, when the voltage of the terminal 21*a* temporarily rises in the case where the FET 217 is not disposed, the voltage between the second gate and the second source of the FET 217 temporarily drops in the first transient state (the FET 217 has the characteristics of Case 1 in FIG. 3), and thus the voltage rising of the terminal 21*a* due to the first control voltage can be suppressed. Additionally, in a fourth transient state in which the fourth control voltage changes from the fourth OFF voltage to the fourth ON voltage, when the voltage of the terminal 21*a* temporarily rises in a case where the FET 218 is not disposed, a voltage between the fifth gate and the fifth source of the FET 218 temporarily drops in the fourth transient state (the FET 218 has the characteristics of Case 1 in FIG. 3), and thus voltage rising of the terminal 21*a* due to the fourth control voltage can be suppressed.

As a circuit configuration for achieving the above Aspect 2, as illustrated in FIG. 5, the second gate of the FET 217 is connected to the first gate of the FET 211, and the fifth gate of the FET 218 is connected to the fourth gate of the FET 213.

According to this, the FET 217 operates in a logically identical manner to the FET 211, and thus in the first transient state in which the first control voltage changes from the first OFF voltage to the first ON voltage, the voltage between the second gate and the second source temporarily drops in the FET 217, and thus it is possible to suppress the voltage rising of the terminal 21*a* due to the first control voltage. Additionally, the FET 218 operates in a logically identical manner to the FET 213, and thus in the fourth transient state in which the fourth control voltage changes from the fourth OFF voltage to the fourth ON voltage, the voltage between the fifth gate and the fifth source temporarily drops in the FET 218, and thus it is possible to suppress the voltage rising of the terminal 21*a* due to the fourth control voltage.

FIG. 6A is a graph showing transient response characteristics of an output voltage of the switch circuit 521 according to the comparative example. Further, FIG. 6B is a graph showing transient response characteristics of an output voltage of the switch circuit 21 according to the embodiment.

To be more specific, FIG. 6A shows transient characteristics of a voltage at the terminal 521*a* when, from the charge pump circuit 40, the first ON voltage for bringing the FET 211 into the ON state is outputted to the FET 211, and at the same time the fourth OFF voltage for bringing the FET 213 into a fourth OFF state is outputted to the FET 213, and at the same time the OFF voltage for bringing the FET 215 into the OFF state is outputted to the FET 215 in the high-frequency circuit 500 according to the comparative example. In the graph shown in FIG. 6A, a voltage of the terminal 521*a* temporarily rises in a transient state because a voltage is applied to the terminal 521*a* via gate capacitances of the FETs 211, 213 and 215, the voltage being obtained by simultaneously adding a component for the first ON voltage at the first gate of the FET 211 to temporarily drop, a component for the fourth OFF voltage at the fourth gate of the FET 213 to temporarily rise and a component for the OFF voltage at the gate of the FET 215 to temporarily rise.

On the other hand, FIG. 6B shows transient characteristics of a voltage at the terminal 21*a* in the above Aspect 1 in the high-frequency circuit 1 according to the embodiment. That is, when the voltage of the terminal 21*a* temporarily rises, the voltage between the second gate and the second source of the FET 217 temporarily drops in the first transient state (the FET 217 has the characteristics of Case 1 in FIG. 3), and thus the voltage rising of the terminal 21*a* due to the first control voltage is suppressed.

6. Configuration of Switch Circuit 21A According to Modification

Figure 7:
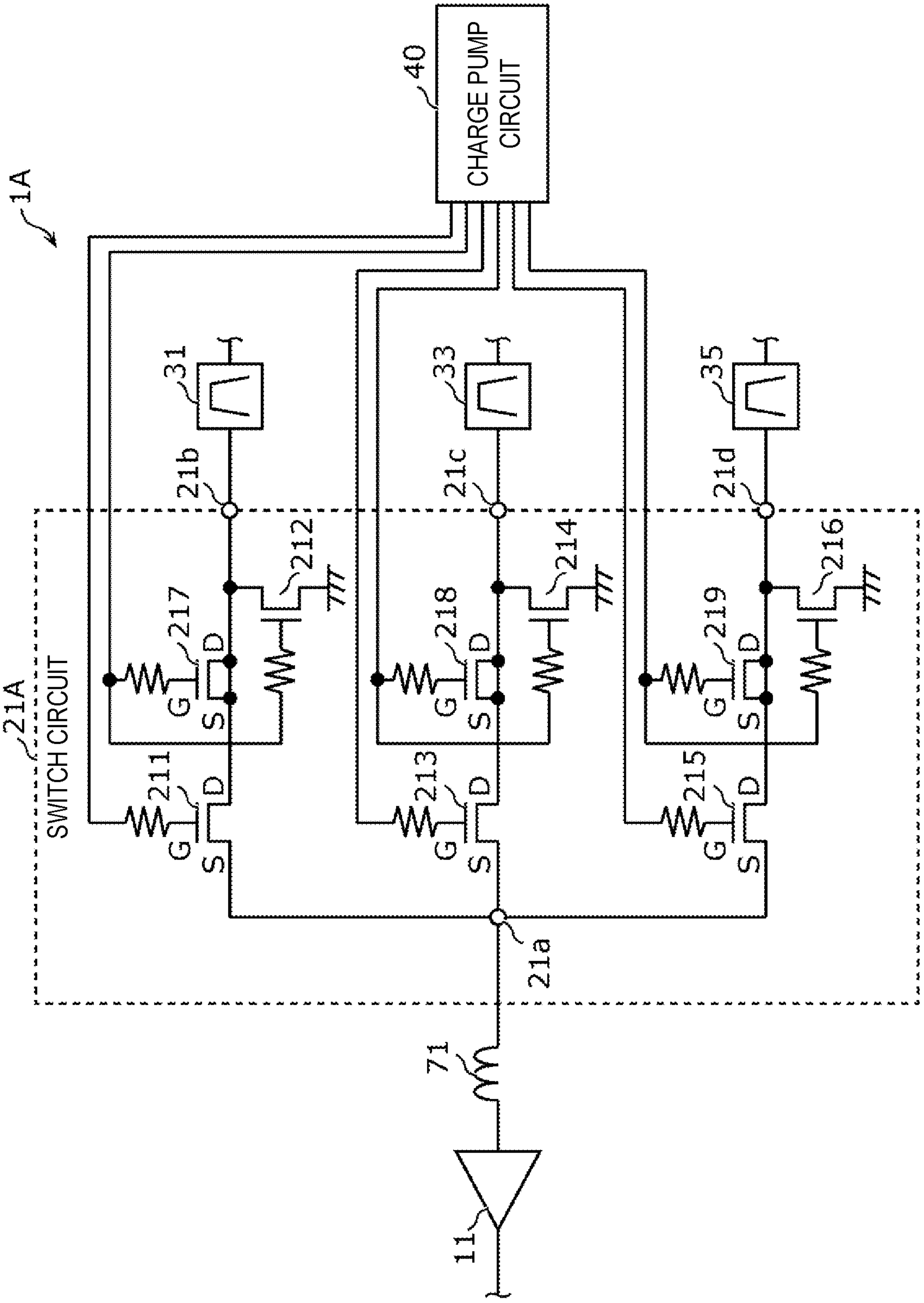
FIG. 7 is a circuit configuration diagram of a high-frequency circuit according to a modification of the embodiment.

Next, a circuit configuration example of a high-frequency circuit 1A according to a modification of the embodiment will be described. FIG. 7 is a circuit configuration diagram of the high-frequency circuit 1A according to the modification of the embodiment. As illustrated in the drawing, the high-frequency circuit 1A according to the present modification includes the low-noise amplifier circuit 11, a switch circuit 21A, the charge pump circuit 40, the filters 31, 33 and 35 and the inductor 71. Note that although not illustrated, the high-frequency circuit 1A includes the power amplifier circuit 12, the level shifters 51 and 52 and the switch circuit 22. The high-frequency circuit 1A according to the present modification is different from the high-frequency circuit 1 according to the embodiment only in a configuration of the switch circuit 21A. Hereinafter, the high-frequency circuit 1A according to the present modification will be described focusing on a circuit configuration of the switch circuit 21A, which is a different configuration, and switching operation of the switch circuit 21A, while the description of the same configurations as those of the high-frequency circuit 1 according to the embodiment is omitted.

The switch circuit 21A includes the terminals 21*a* (the second terminal), 21*b* (the first terminal), 21*c* (the third terminal) and 21*d*, the FETs 211, 212, 213, 214, 215, 216, 217, 218 and 219. The switch circuit 21A according to the present modification is different from the switch circuit 21 according to the embodiment only in gate connection configurations of the FETs 211 to 219. In the following, the description of the same configuration of the switch circuit 21A as that of the switch circuit 21 will be omitted, and the gate connection configurations of the FETs 211 to 219 will be mainly described.

Aspect 3

When the first control voltage outputted from the charge pump circuit 40 is the first ON voltage for bringing the FET 211 into the ON state, the second control voltage outputted from the charge pump circuit 40 is the second OFF voltage for bringing the FET 217 in which the second drain and the second source of the FET 217 are not short-circuited into the OFF state.

According to this, in the first transient state in which the first control voltage changes from the first OFF voltage to the first ON voltage, when the voltage of the terminal 21*a* temporarily drops in the case where the FET 217 is not disposed, the voltage between the second gate and the second source of the FET 217 temporarily rises in a second transient state (the FET 217 has the characteristics of Case 2 in FIG. 3), and thus the voltage dropping of the terminal 21*a* due to the first control voltage can be suppressed.

As a circuit configuration for achieving the above Aspect 3, as illustrated in FIG. 7, the second gate of the FET 217 is connected to the third gate of the FET 212.

According to this, the FET 217 operates in a logically inverted manner to the FET 211, and thus in the first transient state in which the first control voltage changes from the first OFF voltage to the first ON voltage, the voltage between the second gate and the second source temporarily rises in the FET 217, and thus the voltage dropping of the terminal 21*a* due to the first control voltage can be suppressed.

In addition, as a circuit configuration for achieving the above Aspect 3, the second OFF voltage may be constantly applied to the second gate of the FET 217 regardless of whether the first ON voltage is applied to the FET 211.

Aspect 4

When the first control voltage outputted from the charge pump circuit 40 is the first ON voltage for bringing the FET 211 into the ON state, the second control voltage outputted from the charge pump circuit 40 is set to the second OFF voltage for bringing the FET 217 in which the second drain and the second source of the FET 217 are not short-circuited into the OFF state. Further, when the fourth control voltage outputted from the charge pump circuit 40 is the fourth ON voltage for bringing the FET 213 into the ON state, the fifth control voltage outputted from the charge pump circuit 40 is set to a fifth OFF voltage for bringing the FET 218 in which the fifth drain and the fifth source of the FET 218 are not short-circuited into the OFF state.

According to this, in the first transient state in which the first control voltage changes from the first OFF voltage to the first ON voltage, when the voltage of the terminal 21*a* temporarily drops in the case where the FET 217 is not disposed, the voltage between the second gate and the second source of the FET 217 temporarily rises in the first transient state (the FET 217 has the characteristics of Case 2 in FIG. 3), and thus the voltage dropping of the terminal 21*a* due to the first control voltage can be suppressed. Additionally, in the fourth transient state in which the fourth control voltage changes from the fourth OFF voltage to the fourth ON voltage, when the voltage of the terminal 21*a* temporarily drops in the case where the FET 218 is not disposed, the voltage between the fifth gate and the fifth source of the FET 218 temporarily rises in the fourth transient state (the FET 218 has the characteristics of Case 2 in FIG. 3), and thus the voltage dropping of the terminal 21*a* due to the fourth control voltage can be suppressed.

As a circuit configuration for achieving the above Aspect 4, as illustrated in FIG. 7, the second gate of the FET 217 is connected to the third gate of the FET 212, and the fifth gate of the FET 218 is connected to the sixth gate of the FET 214.

According to this, the FET 217 operates in a logically inverted manner to the FET 211, and thus in the first transient state in which the first control voltage changes from the first OFF voltage to the first ON voltage, the voltage between the second gate and the second source temporarily rises in the FET 217, and thus the voltage dropping of the terminal 21*a* due to the first control voltage can be suppressed. Additionally, the FET 218 operates in a logically inverted manner to the FET 213, and thus in the fourth transient state in which the fourth control voltage changes from the fourth OFF voltage to the fourth ON voltage, the voltage between the fifth gate and the fifth source temporarily rises in the FET 218, and thus the voltage dropping of the terminal 21*a* due to the fourth control voltage can be suppressed.

In addition, as a circuit configuration for achieving the above Aspect 4, the second OFF voltage may be constantly applied to the second gate of the FET 217 regardless of whether the first ON voltage is applied to the FET 211, and the fifth OFF voltage may be constantly applied to the fifth gate of the FET 218 regardless of whether the fourth ON voltage is applied to the FET 213.

Note that when a control voltage supplied to at least one of the FETs 211, 213 and 215 constituting the switch circuit 21 is the ON voltage, whether gate voltages of the FETs 217 to 219 are caused to temporarily rise or drop is determined depending on whether the voltage at the terminal 21*a* in a state where the FETs 217 to 219 are not added to the switch circuit 21 temporarily rises or drops. The switch circuit 21 is configured such that the OFF voltage is applied to the gates of the FETs 217 to 219 when the gate voltages of the FETs 217 to 219 are caused to temporarily rise, and is configured such that the ON voltage is applied to the gates of the FETs 217 to 219 when the gate voltages of the FETs 217 to 219 are caused to temporarily drop.

In addition, in the high-frequency circuit 1, when parameters that affect switching characteristics, such as gate widths of the FETs 211 to 213, are the same for the FETs, one FET having characteristics equivalent to those of the FETs 217 to 219 may be disposed in a path connecting the terminal 21*a* and the inductor 71 instead of disposing the FETs 217 to 219.

In addition, in the high-frequency circuit 1, the switch circuit 21 only needs to include at least one of the FETs 211 to 213. Further, the high-frequency circuit 1 may have four or more receive paths, and in this case, the switch circuit 21 includes, in addition to the FETs 211 to 213 disposed in series respectively in a first receive path to a third receive path, an FET disposed in series in a fourth receive path.

7. Effects or the Like

As described above, the high-frequency circuit 1 according to the embodiment includes the switch circuit 21 having the terminals 21*a* and 21*b* and configured to switch between connection and disconnection between the terminals 21*a* and 21*b*, and the charge pump circuit 40 configured to supply a control voltage to the switch circuit 21, wherein the switch circuit 21 includes the FET 211 having the first gate, the first drain and the first source, where the first gate is supplied with the first control voltage from the charge pump circuit 40, the first drain is connected to the terminal 21*b*, and the first source is connected to the terminal 21*a*, and the FET 217 having the second gate, the second drain and the second source, where the second gate is supplied with the second control voltage from the charge pump circuit 40, the second drain and the second source are connected to the path connecting the terminal 21*b*, the FET 211 and the terminal 21*a*, and the second drain and the second source are short-circuited.

At a time when the control voltage supplied from the charge pump circuit 40 is switched between the ON voltage and the OFF voltage, the control voltage may unnecessarily fluctuate. When the control voltage fluctuates at the above time, the fluctuation propagates to the terminal 21*a* via a gate capacitance between the first gate and the first source, and the voltage of the terminal 21*a* fluctuates in a transient manner. On the other hand, the FET 217 in which the source and the drain are short-circuited is disposed in a path connecting the terminal 21*b* and the terminal 21*a*, thus it is possible to suppress the transient fluctuation of the voltage at the terminal 21*a* by supplying the second control voltage in accordance with a fluctuation direction of the control voltage without necessarily affecting conduction and non-conduction of the switch circuit 21 in a stationary state. Thus, a convergence time of the transient fluctuation of the switch circuit 21 can be shortened.

Further, for example, in the high-frequency circuit 1, when the first control voltage is the first ON voltage for bringing the FET 211 into the ON state, the second control voltage is the second ON voltage for bringing the FET 217 in which the second drain and the second source are not short-circuited into the ON state.

According to this, in the first transient state in which the first control voltage changes from the first OFF voltage to the first ON voltage, when the voltage of the terminal 21*a* temporarily rises in the case where the FET 217 is not disposed, the voltage between the second gate and the second source of the FET 217 temporarily drops in the first transient state, and thus the voltage rising of the terminal 21*a* due to the first control voltage can be suppressed.

Further, for example, in the high-frequency circuit 1, the second gate is connected to the first gate.

According to this, the FET 217 operates in a logically identical manner to the FET 211, and thus in the first transient state in which the first control voltage changes from the first OFF voltage to the first ON voltage, a voltage between the second gate, and the second drain and the second source temporarily drops in the FET 217, and thus the voltage rising of the terminal 21*a* due to the first control voltage can be suppressed.

Further, for example, in the high-frequency circuit 1A according to the modification, when the first control voltage is the first ON voltage for bringing the FET 211 into the ON state, the second control voltage is the second OFF voltage for bringing the FET 217 in which the second drain and the second source are not short-circuited into the OFF state.

According to this, in the first transient state in which the first control voltage changes from the first OFF voltage to the first ON voltage, when the voltage of the terminal 21*a* temporarily drops in the case where the FET 217 is not disposed, the voltage between the second gate and the second source of the FET 217 temporarily rises in the second transient state, and thus the voltage dropping of the terminal 21*a* due to the first control voltage can be suppressed.

Further, for example, the high-frequency circuit 1A further includes the FET 212 having the third gate, the third drain and the third source, where the third gate is supplied with the third control voltage from the charge pump circuit 40, the third drain is connected to the terminal 21*b*, and the third source is connected to the ground, and the FET 212 is brought into the OFF state when the FET 211 is in the ON state, the FET 212 is brought into the ON state when the FET 211 is in the OFF state, and the second gate is connected to the third gate.

According to this, the FET 217 operates in a logically inverted manner to the FET 211, and thus in the first transient state in which the first control voltage changes from the first OFF voltage to the first ON voltage, the voltage between the second gate, and the second drain and the second source temporarily rises in the FET 217, and thus the voltage dropping of the terminal 21*a* due to the first control voltage can be suppressed.

In addition, for example, in the high-frequency circuits 1 and 1A, the ON voltage temporarily drops in the first transient state in which the first control voltage changes from the OFF voltage for the FET 211 to be in the OFF state to the ON voltage for the FET 211 to be in the ON state, and the OFF voltage temporarily rises in the second transient state in which the first control voltage changes from the ON voltage to the OFF voltage.

Even when the first control voltage outputted from the charge pump circuit 40 fluctuates in the first transient state, since the FET 217 is disposed in the path connecting the terminal 21*b* and the terminal 21*a*, it is possible to suppress the transient fluctuation in the voltage at the terminal 21*a* without necessarily affecting conduction and non-conduction of the switch circuit 21 in the stationary state, by supplying the second control voltage in accordance with the fluctuation direction of the control voltage.

Further, for example, in the high-frequency circuit 1, the switch circuit 21 further includes the terminal 21*c*, the FET 213 having the fourth gate, the fourth drain and the fourth source, where the fourth gate is supplied with the fourth control voltage from the charge pump circuit 40, the fourth drain is connected to the terminal 21*c*, and the fourth source is connected to the terminal 21*a*, and the FET 218 having the fifth gate, the fifth drain and the fifth source, where the fifth gate is supplied with the fifth control voltage from the charge pump circuit 40, the fifth drain and the fifth source are connected to the path connecting the terminal 21*c*, the FET 213 and the terminal 21*a*, and the fifth drain and the fifth source are short-circuited.

According to this, since the FET 217 is disposed in the path connecting the terminal 21*b* and the terminal 21*a*, and the FET 218 is disposed in the path connecting the terminal 21*c* and the terminal 21*a*, it is possible to suppress the transient fluctuation of the voltage at the terminal 21*a* without necessarily affecting conduction and non-conduction of the switch circuit 21 in the stationary state by supplying a control voltage to be supplied to the FETs 217 and 218 in accordance with the fluctuation direction of the control voltage. Thus, the convergence time of the transient fluctuation of the switch circuit 21 can be shortened.

Further, for example, in the high-frequency circuit 1, when the first control voltage is the first ON voltage for bringing the FET 211 into the ON state, the second control voltage is the second ON voltage for bringing the FET 217 in which the second drain and the second source are not short-circuited into the ON state, and when the fourth control voltage is the fourth ON voltage for bringing the FET 213 into the ON state, the fifth control voltage is the fifth ON voltage for bringing the FET 218 in which the fifth drain and the fifth source are not short-circuited into the ON state.

According to this, in the first transient state in which the first control voltage changes from the first OFF voltage to the first ON voltage, when the voltage of the terminal 21*a* temporarily rises in the case where the FET 217 is not disposed, a voltage between the second gate, and the second drain and the second source of the FET 217 temporarily drops in the first transient state, and thus the voltage rising of the terminal 21*a* due to the first control voltage can be suppressed. Additionally, in the fourth transient state in which the fourth control voltage changes from the fourth OFF voltage to the fourth ON voltage, when the voltage of the terminal 21*a* temporarily rises in the case where the FET 218 is not disposed, a voltage between the fifth gate, and the fifth drain and the fifth source of the FET 218 temporarily drops in the fourth transient state, and thus the voltage rising of the terminal 21*a* due to the fourth control voltage can be suppressed.

Further, for example, in the high-frequency circuit 1, the fifth gate is connected to the fourth gate.

According to this, the FET 218 operates in a logically identical manner to the FET 213, and thus in the fourth transient state in which the fourth control voltage changes from the fourth OFF voltage to the fourth ON voltage, the voltage between the fifth gate, and the fifth drain and the fifth source temporarily drops in the FET 218, and thus the voltage rising of the terminal 21*a* due to the fourth control voltage can be suppressed.

Further, for example, in the high-frequency circuit 1A, when the first control voltage is the first ON voltage for bringing the FET 211 into the ON state, the second control voltage is the second OFF voltage for bringing the FET 217 in which the second drain and the second source are not short-circuited into the OFF state, and when the fourth control voltage is the fourth ON voltage for bringing the FET 213 into the ON state, the fifth control voltage is the fifth OFF voltage for bringing the FET 218 in which the fifth drain and the fifth source are not short-circuited into the OFF state.

According to this, in the first transient state in which the first control voltage changes from the first OFF voltage to the first ON voltage, when the voltage of the terminal 21*a* temporarily drops in the case where the FET 217 is not disposed, the voltage between the second gate, and the second drain and the second source of the FET 217 temporarily rises in the first transient state, and thus the voltage dropping of the terminal 21*a* due to the first control voltage can be suppressed. Additionally, in the fourth transient state in which the fourth control voltage changes from the fourth OFF voltage to the fourth ON voltage, when the voltage of the terminal 21*a* temporarily rises in the case where the FET 218 is not disposed, the voltage between the fifth gate, and the fifth drain and the fifth source of the FET 218 temporarily rises in the fourth transient state, and thus the voltage dropping of the terminal 21*a* due to the fourth control voltage can be suppressed.

Further, for example, the high-frequency circuit 1A further includes the FET 214 having the sixth gate, the sixth drain and the sixth source, where the sixth gate is supplied with the sixth control voltage from the charge pump circuit 40, the sixth drain is connected to the terminal 21*c*, and the sixth source is connected to the ground, and the FET 214 is brought into the OFF state when the FET 213 is in the ON state, the FET 214 is brought into the ON state when the FET 213 is in the OFF state, and the fifth gate is connected to the sixth gate.

According to this, the FET 218 operates in a logically inverted manner to the FET 213, and thus in the fourth transient state in which the fourth control voltage changes from the fourth OFF voltage to the fourth ON voltage, the voltage between the fifth gate, and the fifth drain and the fifth source temporarily rises in the FET 218, and thus the voltage dropping of the terminal 21*a* due to the fourth control voltage can be suppressed.

Further, for example, the high-frequency circuits 1 and 1A each further includes the level shifter 51 that is connected to the charge pump circuit 40 and the switch circuit 21 therebetween and converts a voltage outputted from the charge pump circuit 40 into the first control voltage and the second control voltage.

According to this, the voltage outputted from the charge pump circuit 40 can be converted into a control voltage corresponding to the sizes and characteristics of the FETs constituting the switch circuit 21.

Further, for example, the high-frequency circuits 1 and 1A each further includes the low-noise amplifier circuit 11 where the input end is connected to the terminal 21*a*.

According to this, the FET 217 in which the source and the drain are short-circuited is disposed in a path connecting the input end of the low-noise amplifier circuit 11 and the terminal 21*b*, thus it is possible to suppress the transient fluctuation of the voltage at the terminal 21*a* without necessarily affecting conduction and non-conduction of the switch circuit 21 in the stationary state by supplying the second control voltage in accordance with the fluctuation direction of the control voltage. Thus, the convergence time of the transient fluctuation of the switch circuit 21 can be shortened, and thus a deterioration in reception performance of the low-noise amplifier circuit 11 can be suppressed.

Further, for example, the high-frequency circuits 1 and 1A each further includes the power amplifier circuit 12, and the switch circuit 22 having the terminals 22*a* and 22*b*, where the terminal 22*a* is connected to the output end of the power amplifier circuit 12, the charge pump circuit 40 is configured to supply a control voltage to the switch circuits 21 and 22, the switch circuit 22 includes the seventh FET having the seventh gate, the seventh drain and the seventh source, where the seventh gate is supplied with the seventh control voltage from the charge pump circuit 40, the seventh drain is connected to the terminal 22*b*, and the seventh source is connected to the terminal 22*a*.

According to this, due to a transient fluctuation of the control voltage supplied from the charge pump circuit 40 to the switch circuit 22, the control voltage supplied from the charge pump circuit 40 to the switch circuit 21 may fluctuate in a transient manner. Even in this case, the FET 217 is disposed in the path connecting the terminal 21*b* and the terminal 21*a*, thus it is possible to suppress the transient fluctuation of the voltage at the terminal 21*a* without necessarily affecting conduction and non-conduction of the switch circuit 21 in the stationary state by supplying the second control voltage in accordance with a fluctuation direction of the control voltage.

In addition, for example, in the high-frequency circuits 1 and 1A, the gate width of the seventh FET is larger than the gate width of the FET 211.

According to this, due to the large gate capacitance of the seventh FET included in the switch circuit 22, the ON voltage outputted from the charge pump circuit 40 may temporarily drop at the time when the OFF voltage changes to the ON voltage. Further, at the time when the ON voltage changes to the OFF voltage, the OFF voltage outputted from the charge pump circuit 40 may temporarily rise. Even in this case, the FET 217 is disposed in the path connecting the terminal 21*b* and the terminal 21*a*, thus it is possible to suppress the transient fluctuation of the voltage at the terminal 21*a* without necessarily affecting conduction and non-conduction of the switch circuit 21 in the stationary state by supplying the second control voltage in accordance with a fluctuation direction of the control voltage.

Further, the communication device 4 according to the present embodiment includes the RFIC 3 configured to process a high-frequency signal, and the high-frequency circuit 1 configured to transmit a high-frequency signal between the RFIC 3 and the antenna 2.

According to this, similar effects as those of the high-frequency circuit 1 can be achieved in the communication device 4.

Other Embodiments

Although the high-frequency circuits and the communication device according to the present disclosure have been described above based on the embodiment and the modification, the high-frequency circuits and the communication device according to the present disclosure are not limited to the above-described embodiment and modification. The present disclosure also includes other embodiments achieved by combining any constituent elements in the above-described embodiment and modification, modifications obtained by making various modifications to the above-described embodiment and modification that can be conceived by those skilled in the art without necessarily departing from the spirit of the present disclosure, and various devices incorporating the above-described high-frequency circuits.

For example, in the circuit configuration of the high-frequency circuit according to each of the embodiment and the modification, another circuit element, wiring line, or the like may be inserted between the paths connecting the circuit elements and the signal paths disclosed in the drawings. For example, an impedance matching circuit may be inserted between the filter and the antenna connection terminal.

The features of the high-frequency circuits and the communication device described based on the above-described embodiment and the modification will be described below.

<1>

A high-frequency circuit, comprising:

a first switch circuit having a first terminal and a second terminal and configured to switch between connection and disconnection between the first terminal and the second terminal; and a voltage supply circuit configured to supply a control voltage to the first switch circuit, wherein the first switch circuit includes a first FET having a first gate, a first drain and a first source, where the first gate is supplied with a first control voltage from the voltage supply circuit, one of the first drain and the first source is connected to the first terminal, and an other of the first drain and the first source is connected to the second terminal, and a second FET having a second gate, a second drain and a second source, where the second gate is supplied with a second control voltage from the voltage supply circuit, the second drain and the second source are connected to a path connecting the first terminal, the first FET and the second terminal, and the second drain and the second source are short-circuited.

<2>

The high-frequency circuit according to <1>, wherein when the first control voltage is a first ON voltage for bringing the first FET into an ON state, the second control voltage is a second ON voltage for bringing the second FET in which the second drain and the second source are not short-circuited into the ON state.

<3>

The high-frequency circuit according to <1> or <2>, wherein the second gate is connected to the first gate.

<4>

The high-frequency circuit according to <1>, wherein when the first control voltage is a first ON voltage for bringing the first FET into an ON state, the second control voltage is a second OFF voltage for bringing the second FET in which the second drain and the second source are not short-circuited into an OFF state.

<5>

The high-frequency circuit according to <1> or <2>, further comprising:

a third FET having a third gate, a third drain and a third source, where the third gate is supplied with a third control voltage from the voltage supply circuit, one of the third drain and the third source is connected to the first terminal, and an other of the third drain and the third source is connected to a ground, wherein the third FET is brought into an OFF state when the first FET is in an ON state, and the third FET is brought into the ON state when the first FET is in the OFF state, and the second gate is connected to the third gate.

<6>

The high-frequency circuit according to any one of <1> to <5>, wherein in a first transient state in which the first control voltage changes from an OFF voltage for the first FET to be in an OFF state to an ON voltage for the first FET to be in an ON state, the ON voltage temporarily drops, and in a second transient state in which the first control voltage changes from the ON voltage to the OFF voltage, the OFF voltage temporarily rises.

<7>

The high-frequency circuit according to any one of <1> to <6>, wherein the first switch circuit further includes a third terminal, a fourth FET having a fourth gate, a fourth drain and a fourth source, where the fourth gate is supplied with a fourth control voltage from the voltage supply circuit, one of the fourth drain and the fourth source is connected to the third terminal, and another of the fourth drain and the fourth source is connected to the second terminal, and a fifth FET having a fifth gate, a fifth drain and a fifth source, where the fifth gate is supplied with a fifth control voltage from the voltage supply circuit, the fifth drain and the fifth source are connected to a path connecting the third terminal, the fourth FET and the second terminal, and the fifth drain and the fifth source are short-circuited.

<8>

The high-frequency circuit according to <7>, wherein when the first control voltage is a first ON voltage for bringing the first FET into an ON state, the second control voltage is a second ON voltage for bringing the second FET in which the second drain and the second source are not short-circuited into the ON state, and when the fourth control voltage is a fourth ON voltage for bringing the fourth FET into the ON state, the fifth control voltage is a fifth ON voltage for bringing the fifth FET in which the fifth drain and the fifth source are not short-circuited into the ON state.

<9>

The high-frequency circuit according to <7> or <8>, wherein the fifth gate is connected to the fourth gate.

<10>

The high-frequency circuit according to <7>, wherein when the first control voltage is a first ON voltage for bringing the first FET into an ON state, the second control voltage is a second OFF voltage for bringing the second FET in which the second drain and the second source are not short-circuited into an OFF state, and when the fourth control voltage is a fourth ON voltage for bringing the fourth FET into the ON state, the fifth control voltage is a fifth OFF voltage for bringing the fifth FET in which the fifth drain and the fifth source are not short-circuited into the OFF state.

<11>

The high-frequency circuit according to <7> or <8>, further comprising:

a sixth FET having a sixth gate, a sixth drain and a sixth source, where the sixth gate is supplied with a sixth control voltage from the voltage supply circuit, one of the sixth drain and the sixth source is connected to the third terminal, and another of the sixth drain and the sixth source is connected to a ground, wherein the sixth FET is brought into an OFF state when the fourth FET is in an ON state, and the sixth FET is brought into the ON state when the fourth FET is in the OFF state, and the fifth gate is connected to the sixth gate.

<12>

The high-frequency circuit according to any one of <1> to <11>, further comprising:

a level shifter connected to the voltage supply circuit and the first switch circuit therebetween and configured to convert a voltage outputted from the voltage supply circuit into the first control voltage and the second control voltage.

<13>

The high-frequency circuit according to any one of <1> to <12>, further comprising:

a low-noise amplifier circuit having an input end connected to the second terminal.

<14>

The high-frequency circuit according to any one of <1> to <13>, further comprising:

a power amplifier circuit; and a second switch circuit having a fourth terminal and a fifth terminal, where the fifth terminal is connected to an output end of the power amplifier circuit, wherein the voltage supply circuit is configured to supply a control voltage to the first switch circuit and the second switch circuit, and the second switch circuit includes a seventh FET having a seventh gate, a seventh drain and a seventh source, where the seventh gate is supplied with a seventh control voltage from the voltage supply circuit, one of the seventh drain and the seventh source is connected to the fourth terminal, and another of the seventh drain and the seventh source is connected to the fifth terminal.

<15>

The high-frequency circuit according to <14>, wherein a gate width of the seventh FET is larger than a gate width of the first FET.

<16>

A communication device, comprising:

a signal processing circuit configured to process a high-frequency signal; and the high-frequency circuit according to any one of <1> to <15> configured to transmit the high-frequency signal between the signal processing circuit and an antenna.

The present disclosure can be widely used in communication devices such as mobile phones as a high-frequency circuit disposed in a front-end portion.

What is claimed is:

1. A high-frequency circuit, comprising:

a first switch circuit having a first terminal and a second terminal, and configured to selectively connect the first terminal and the second terminal to each other; and a voltage supply circuit configured to supply a switch control voltage to the first switch circuit, wherein the first switch circuit comprises:

a first field-effect transistor (FET) having a first gate, a first drain, and a first source, the first gate being supplied with a first control voltage from the voltage supply circuit, one of the first drain and or the first source being connected to the first terminal, and the other of the first drain and the first source being connected to the second terminal, a second FET having a second gate, a second drain, and a second source, the second gate being supplied with a second control voltage from the voltage supply circuit, and the second drain and the second source being connected to a path connecting the first terminal, the first FET, and the second terminal, and the second drain and the second source being short-circuited.

2. The high-frequency circuit according to claim 1, wherein when the first control voltage is a first ON voltage configured to bring the first FET into an ON state, the second control voltage is a second ON voltage configured to bring the second FET into the ON state, and the second drain and the second source are not short-circuited.

3. The high-frequency circuit according to claim 1, wherein the second gate is connected to the first gate.

4. The high-frequency circuit according to claim 1, wherein when the first control voltage is a first ON voltage configured to bring the first FET into an ON state, the second control voltage is a second OFF voltage configured to bring the second FET into an OFF state, and the second drain and the second source are not short-circuited.

5. The high-frequency circuit according to claim 1, further comprising:

a third FET having a third gate, a third drain and a third source, wherein the third gate is supplied with a third control voltage from the voltage supply circuit, wherein one of the third drain and the third source is connected to the first terminal, and the other of the third drain and the third source is connected to ground, and wherein the third FET is in an OFF state when the first FET is in an ON state, and the third FET is in the ON state when the first FET is in the OFF state, and the second gate is connected to the third gate.

6. The high-frequency circuit according to claim 1, wherein in a first transient state in which the first control voltage changes from an OFF voltage for the first FET to an ON voltage for the first FET, the ON voltage is configured to temporarily drop, and wherein in a second transient state in which the first control voltage changes from the ON voltage to the OFF voltage, the OFF voltage is configured to temporarily rise.

7. The high-frequency circuit according to claim 1, wherein the first switch circuit further comprises:

a third terminal;

a fourth FET having a fourth gate, a fourth drain and a fourth source, the fourth gate being supplied with a fourth control voltage from the voltage supply circuit, one of the fourth drain and the fourth source being connected to the third terminal, and the other of the fourth drain and the fourth source being connected to the second terminal; and a fifth FET having a fifth gate, a fifth drain and a fifth source, where the fifth gate being supplied with a fifth control voltage from the voltage supply circuit, the fifth drain and the fifth source being connected to a path connecting the third terminal, the fourth FET, and the second terminal, and the fifth drain and the fifth source being short-circuited.

8. The high-frequency circuit according to claim 7, wherein when the first control voltage is a first ON voltage configured to bring the first FET into an ON state, the second control voltage is a second ON voltage configured to bring the second FET into the ON state, and the second drain and the second source are not short-circuited, wherein when the fourth control voltage is a fourth ON voltage configured to bring the fourth FET into the ON state, the fifth control voltage is a fifth ON voltage configured to bring the fifth FET into the ON state, and the fifth drain and the fifth source are not short-circuited.

9. The high-frequency circuit according to claim 7, wherein the fifth gate is connected to the fourth gate.

10. The high-frequency circuit according to claim 7, wherein when the first control voltage is a first ON voltage configured to bring the first FET into an ON state, the second control voltage is a second OFF voltage configured to bring the second FET into an OFF state, and the second drain and the second source are not short-circuited, wherein when the fourth control voltage is a fourth ON voltage configured to bring the fourth FET into the ON state, the fifth control voltage is a fifth OFF voltage configured to bring the fifth FET into the OFF state, and the fifth drain and the fifth source are not short-circuited.

11. The high-frequency circuit according to claim 7, further comprising:

a sixth FET having a sixth gate, a sixth drain and a sixth source, the sixth gate being supplied with a sixth control voltage from the voltage supply circuit, one of the sixth drain and the sixth source being connected to the third terminal, and the other of the sixth drain and the sixth source being connected to ground, wherein the sixth FET is in an OFF state when the fourth FET is in an ON state, and the sixth FET is in the ON state when the fourth FET is in the OFF state, and wherein the fifth gate is connected to the sixth gate.

12. The high-frequency circuit according to claim 1, further comprising:

a level shifter connected between the voltage supply circuit and the first switch circuit, and configured to convert a voltage outputted from the voltage supply circuit into the first control voltage and the second control voltage.

13. The high-frequency circuit according to claim 1, further comprising:

a low-noise amplifier circuit having an input end connected to the second terminal.

14. The high-frequency circuit according to claim 1, further comprising:

a power amplifier circuit; and a second switch circuit comprising a fourth terminal, and a fifth terminal connected to an output end of the power amplifier circuit, wherein the voltage supply circuit is configured to supply the switch control voltage to the first switch circuit and to the second switch circuit, wherein the second switch circuit comprises a seventh FET having a seventh gate, a seventh drain, and a seventh source, wherein the seventh gate is supplied with a seventh control voltage from the voltage supply circuit, and wherein one of the seventh drain and the seventh source is connected to the fourth terminal, and the other of the seventh drain and the seventh source is connected to the fifth terminal.

15. The high-frequency circuit according to claim 14, wherein a gate width of the seventh FET is larger than a gate width of the first FET.

16. A communication device, comprising:

a signal processing circuit configured to process a high-frequency signal; and the high-frequency circuit according to claim 1 configured to transmit the high-frequency signal between the signal processing circuit and an antenna.

* * * * *